United States Patent [19]

Bateman et al.

[11] Patent Number: 4,546,321
[45] Date of Patent: Oct. 8, 1985

[54] NON-LINEAR AMPLIFIER SYSTEMS FOR REPETITIVE SIGNALS

[75] Inventors: Glenn Bateman; Richard E. DuPuy, Jr., both of Beaverton, Oreg.

[73] Assignee: Tektronix, Inc., Beaverton, Oreg.

[21] Appl. No.: 509,467

[22] PCT Filed: Dec. 16, 1982

[86] PCT No.: PCT/US82/01747
§ 371 Date: Jun. 13, 1983
§ 102(e) Date: Jun. 13, 1983

[87] PCT Pub. No.: WO83/02371
PCT Pub. Date: Jul. 7, 1983

[30] Foreign Application Priority Data
Dec. 28, 1981 [JP] Japan .............................. 56-2159881

[51] Int. Cl.$^4$ ............................................. G06G 7/12
[52] U.S. Cl. .................................. 328/142; 328/145; 307/490
[58] Field of Search ............... 307/490, 494, 493, 499, 307/264; 328/142, 145, 15; 333/14

[56] References Cited
U.S. PATENT DOCUMENTS

| | | | |
|---|---|---|---|
| 3,518,578 | 6/1970 | Oppenheim | 333/14 |
| 3,875,537 | 4/1975 | Dolby | 333/14 |
| 3,997,845 | 12/1976 | Wegstedt | 328/143 |
| 4,287,491 | 9/1981 | Scholz | 333/14 |
| 4,377,792 | 3/1983 | Blackmer et al. | 307/493 |
| 4,418,317 | 11/1983 | Bateman | 328/145 |

*Primary Examiner*—Stanley D. Miller
*Assistant Examiner*—B. P. Davis
*Attorney, Agent, or Firm*—John Smith-Hill

[57] ABSTRACT

A non-linear amplifier system for a repetitive input signal includes a first amplifier stage for amplifying low level input signals, including noise, in a linear manner and higher level input signals in a non-linear manner. A sampling circuit smooths the output from the first amplifier stage and thereby reduces the amplitude of low level random noise signals. A second amplifier stage receives the output from the sampling circuit and amplifies in a non-linear manner signals corresponding to low level input signals of the first amplifier stage and amplifies in linear manner signals corresponding to higher level input signals of the first amplifier stage. Consequently, low level input signals can be amplified in non-linear manner without introducing substantial errors due to non-linear amplification of low level random noise signals.

5 Claims, 10 Drawing Figures

NON-LINEAR AMPLIFIER SYSTEMS FOR REPETITIVE SIGNALS

This invention relates to non-linear amplifier systems, and more specifically to logarithmic amplifier systems for amplifying repetitive signals.

BACKGROUND OF THE INVENTION

Non-linear amplifiers such as logarithmic amplifiers find wide application especially in the communication field and in measurement instruments, such as, spectrum analyzers, sampling oscilloscopes, and time domain reflectometers for measuring the characteristics of electrical or optical signal transmission lines.

The input signal to be processed in the amplifier system of a measurement instrument such as a fiber optic time domain reflectometer may have a dynamic range which exceeds the dynamic range of a conventional linear amplifier. In order to permit use of such conventional linear amplifiers, the input signal is first processed by a circuit having a non-linear (e.g. logarithmic) transfer function, so as to compress the dynamic range of the input signal and thereby increase the apparent dynamic range of the overall amplifier system.

The dynamic range of the amplifier system may be increased further by using a linear preamplifier to amplify very weak signal components. A conventional preamplifier, however, cannot accept stronger signal levels, and thereby limits the dynamic range of the amplifier system in which it is used.

SUMMARY OF THE INVENTION

According to the present invention there is provided a non-linear amplifier system for a repetitive input signal, comprising a first amplifier stage for amplifying low level input signals in a liner manner and higher level input signals in a non-linear manner, whereby low level input signals are amplified linearly; a sampling circuit for smoothing the output from said first amplifier stage and thereby reducing the amplitude of low level random noise signals; and a second amplifier stage for receiving the output from the sampling circuit and amplifying in non-linear manner signals corresponding to low level input signals of the first amplifier stage and amplifying in linear manner signals corresponding to higher level input signals of the first amplifier stage, whereby low level input signals can be amplified in non-linear manner without introducing substantial errors due to non-linear amplification of low level random noise signals.

In an embodiment of the invention, the amplifier system comprises first and second cascaded amplifier stages. The first amplifier stage amplifies low level input signals linearly and amplifies higher level input signals logarithmically, whereas the second amplifier stage amplifies low level signals logarithmetically and amplifies higher level signals linearly. The sampling circuit smooths the output from the first amplifier stage, eliminating random noise, since the noise level is below the level of signals that are amplified logarithmically by the first amplifier stage. The resulting non-linear amplifier system has a greater dynamic range than conventional amplifiers, and its useful dynamic range includes input signals below the system's input noise level.

BRIEF DESCRIPTION OF THE DRAWINGS

For a better understanding of the invention, and to show how the same may be carried into effect, reference will now be made, by way of example, to the accompanying drawings in which.

Figure 4:
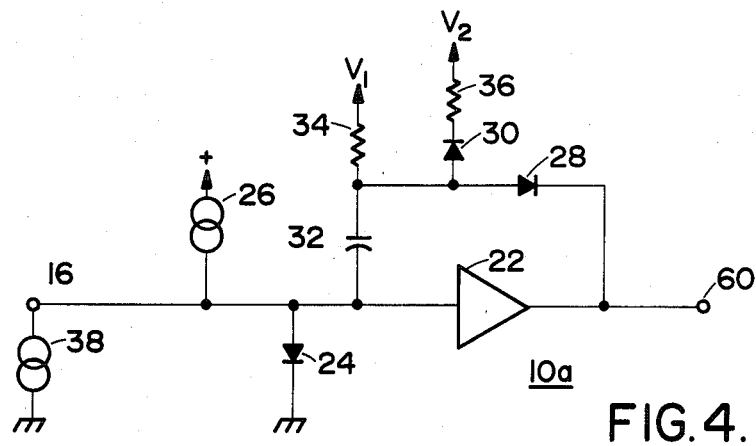
FIG. 4 is a simplified schematic diagram of one portion of the first amplifier stage of the amplifier system.
Figure 5:
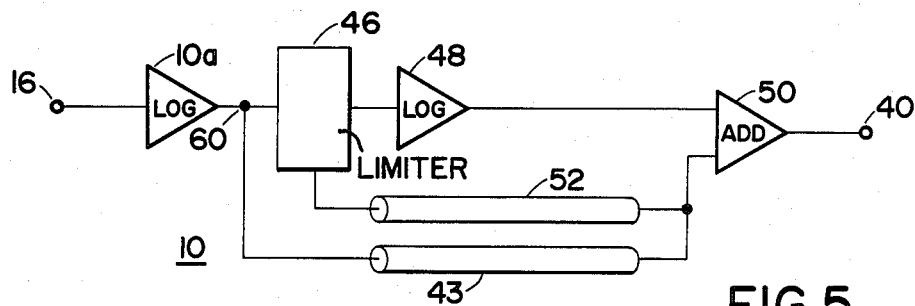
FIG. 5 is a block diagram of the entire first amplifier system.
Figure 7A:
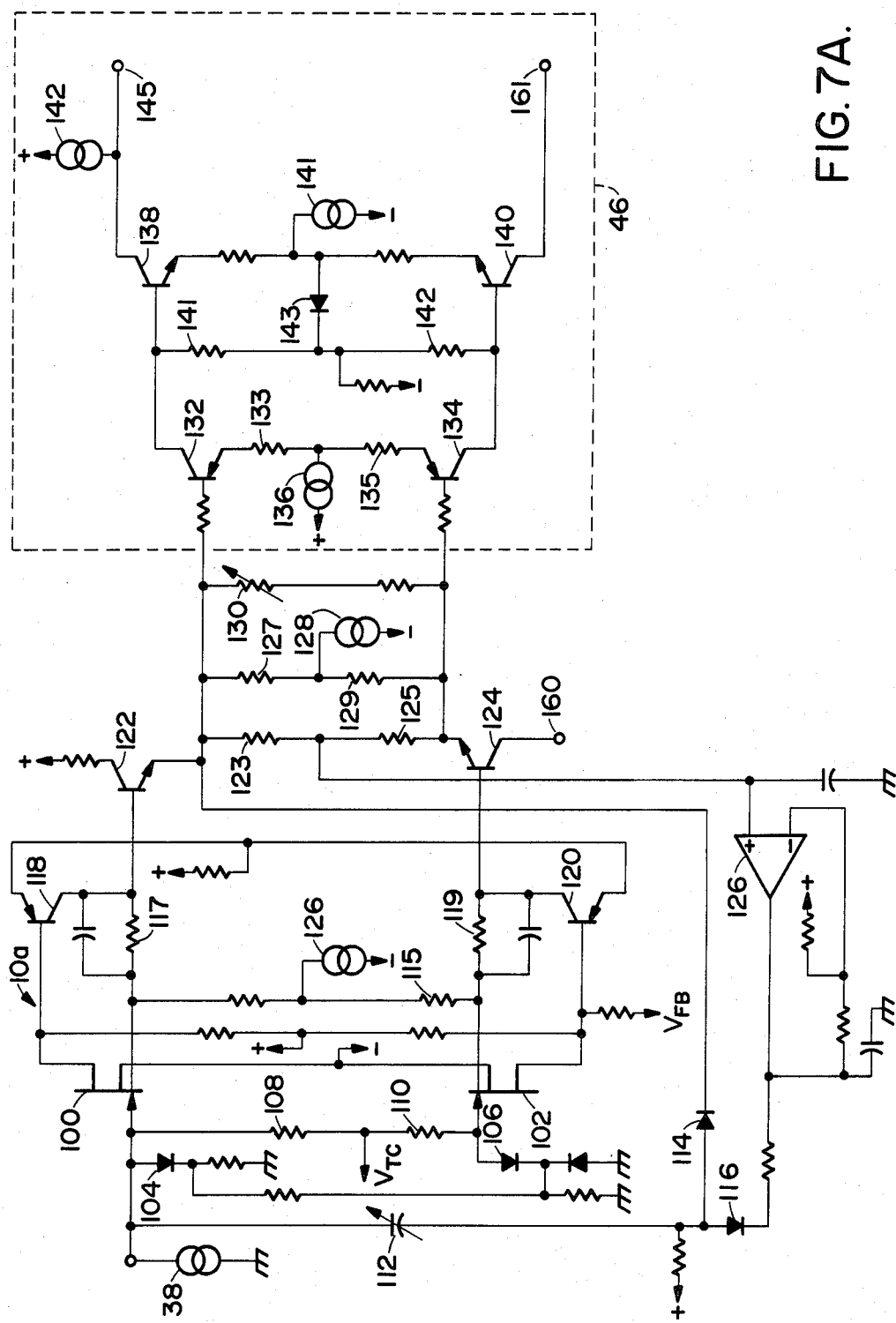
Figure 7B:
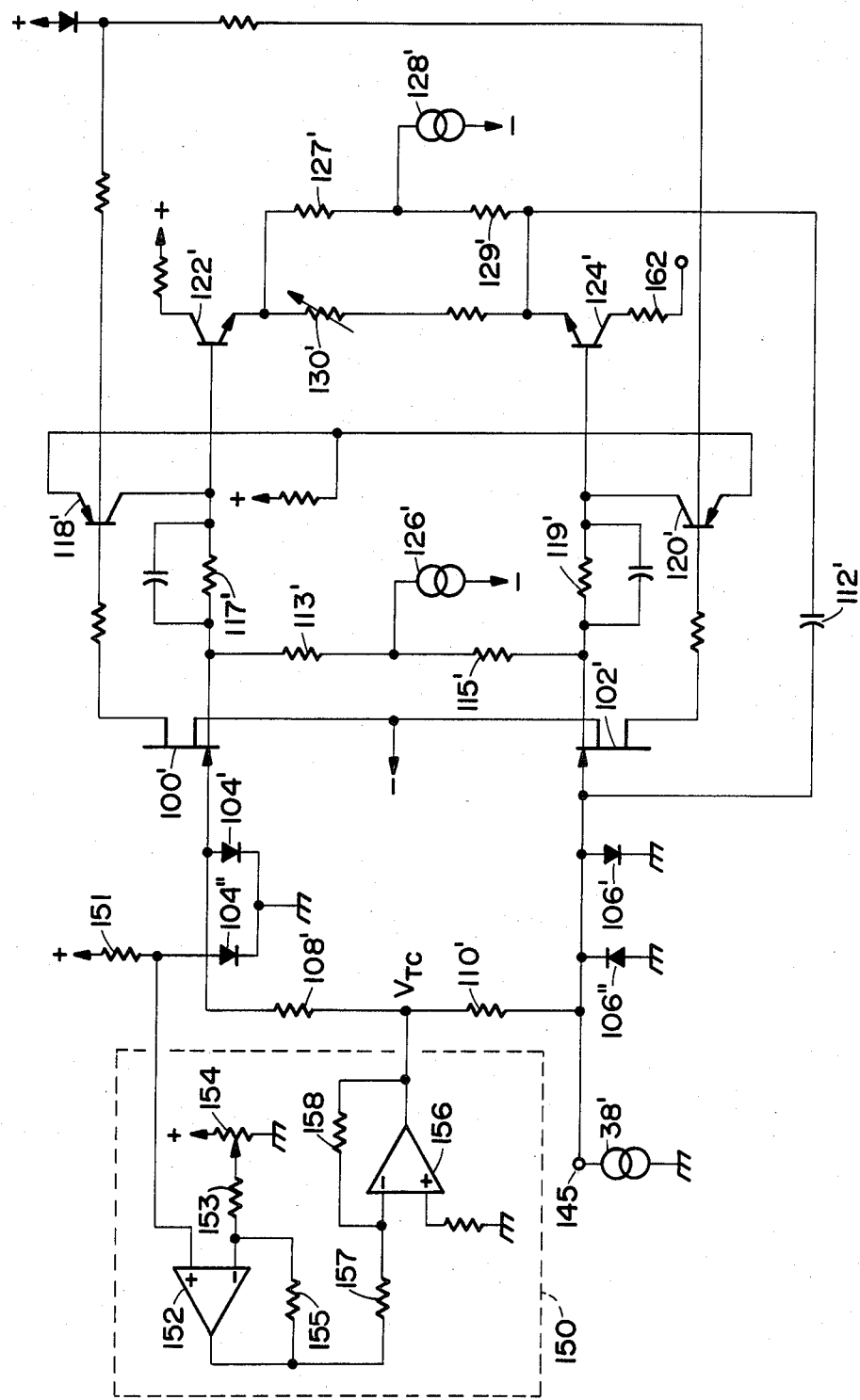
Figure 7C:
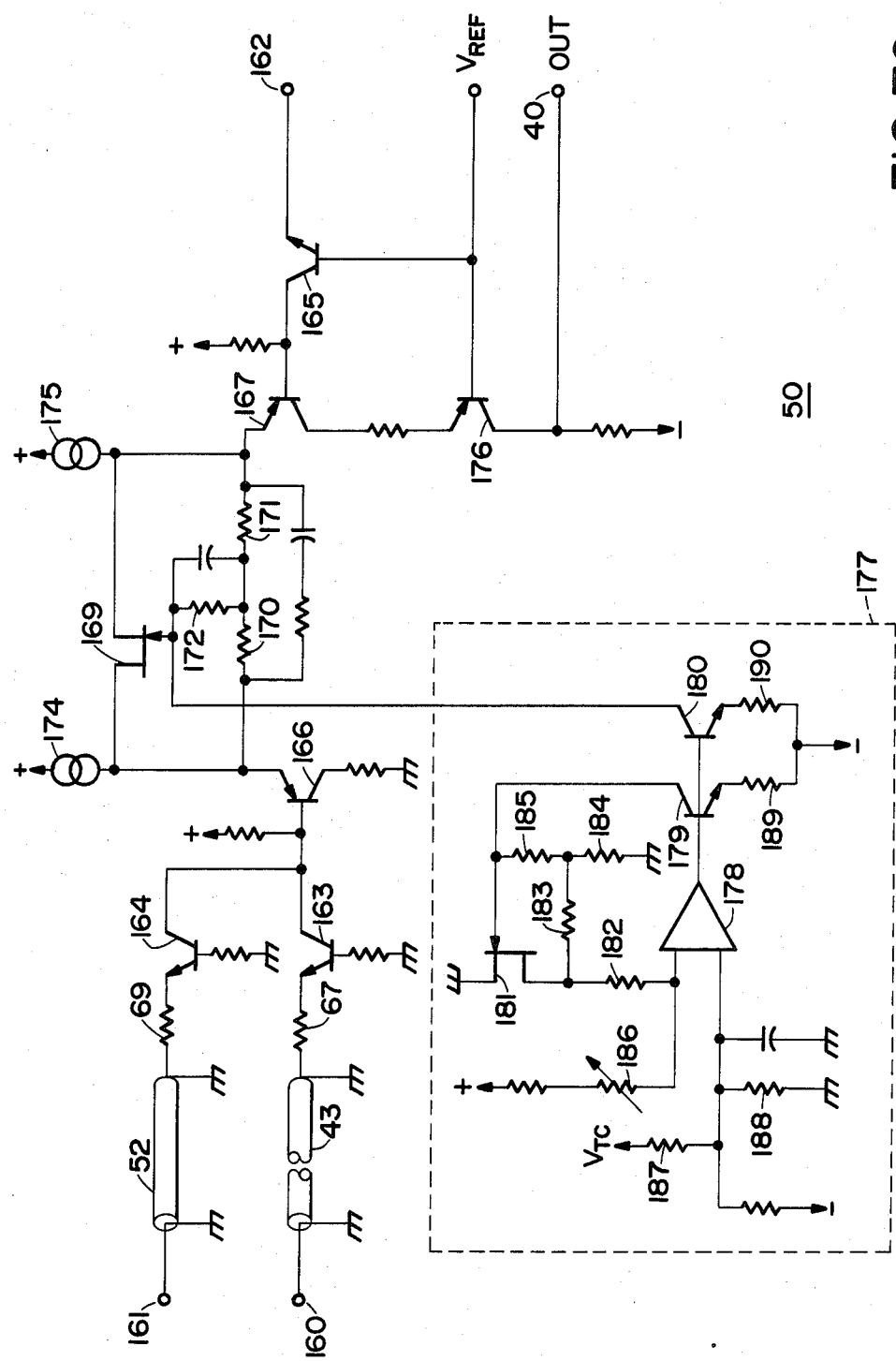
Figure 8:
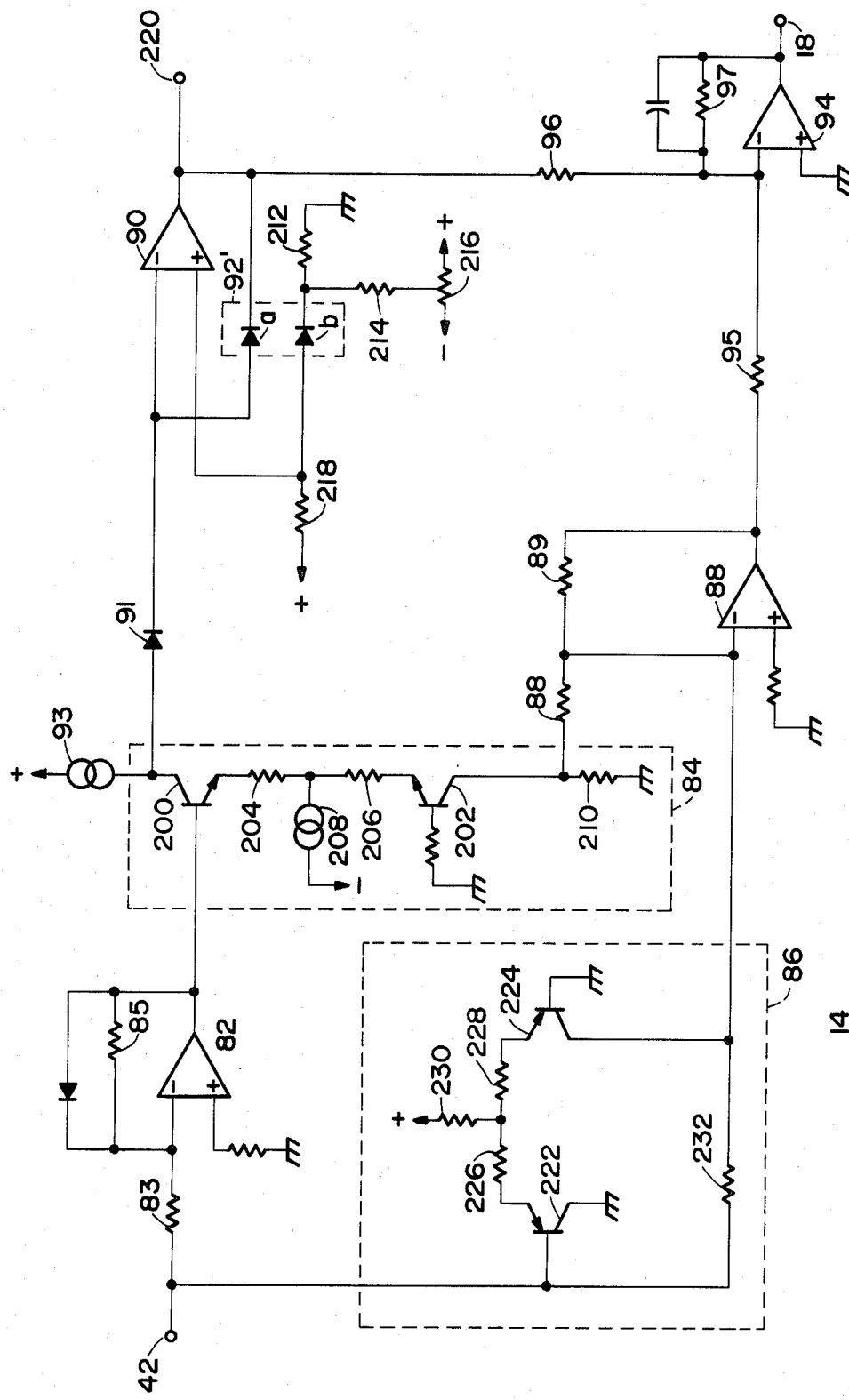

FIG . 6 is a combined block and schematic diagram of the amplifier system;

FIGS. 7A, 7B and 7C are schematic diagrams illustrating the first amplifier stage in greater detail than FIGS. 4 and 5; and FIG. 8 is a schematic diagram of the second amplifier stage.

DETAILED DESCRIPTION OF THE DRAWINGS

Figure 1:
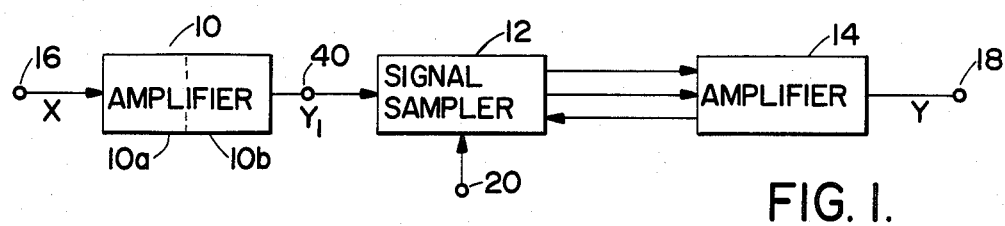
FIG. 1 is a block diagram of an amplifier system embodying the present invention.

FIG. 1 is a simplified block diagram of a non-linear amplifier system embodying the invention. The amplifier system comprises a first non-linear amplifier stage 10, a signal sampler 12, and a second non-linear amplifier stage 14, connected between an input terminal 16 and an output terminal 18. First amplifier stage 10, comprising amplifier apparatus 10a and 10b, has the non-linear gain vs signal level characteristic shown in FIG. 2. That is, amplifier stage 10 exhibits a linear gain within the range of input signal levels substantially below X*, including input noise level Xn, and a logarithmic gain in the signal range substantially above X*. Signal sampler 12 samples the repetitive input signal under control of sampling command clock applied to clock terminal 20. The sampling clock is generated in such a manner that sequentially different portions of the repetitive input signal are sampled or alternatively a plurality of samples on the same portion of the input signal are sampled and filtered before proceeding to the second amplifier stage 14. Second amplifier stage 14 exhibits a logarithmic gain at lower input signal levels and a linear gain at higher signal levels. The resulting output signal is derived from output terminal 18.

Figure 3:
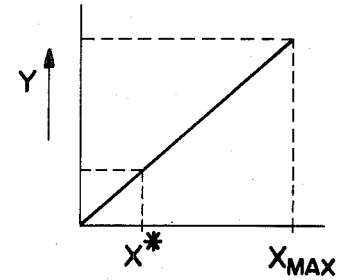

It should be noted that the transition points of logarithmic gain to linear gain of first and second amplifiers 10, 14 should coincide with each other so that the overall amplifier system exhibits the desired logarithmic gain characteristic as shown in FIG. 3. Since the input noise is normally random or "white" noise, the smoothing function of signal sampler 12 effectively eliminates such noise, thereby detecting the signal components buried in noise to improve the useful dynamic range of the overall amplifier system so as to include input signals below the amplifier input noise level. It will be recognized that it is necessary in order to eliminate the noise for the sampling to take place before signals at the level of the noise are amplified logarithmically.

FIG. 4 illustrates in simplified schematic form a practical implementation of the first lin/log amplifier apparatus 10a. As shown in FIG. 4, a high input impedance non-inverting amplifier 22 is used to amplify the input signal current from signal source 38. Shottky barrier diode 24 is connected between the input of amplifier 22 and ground to develop a logarithmic voltage thereacross. A positive feedback loop including capacitor 32, diodes 28, 30 and resistors 34, 36 is connected to amplifier 22.

In the quiescent condition, i.e., when no current is supplied by the signal source 38, diode 24 is forward biased by a small current from current source 26 and diodes 28 and 30 are forward biased by voltage source $V_1$. Current source 26 determines the impedance of diode 24. The voltage potential from voltage source $V_2$ is set to provide equal currents through diodes 28, 30 for thermal balance. The positive feedback is used to reduce the input capacitance of amplifier 22 at low signal levels, thereby maintaining the amplifier's bandwidth. At higher signal levels, i.e., when the current supplied by the signal source 38 exceeds the bias current from source 26, the amplifier bandwidth is set by the impedance of shunt diode 24 and diode 28 becomes non-conductive to prevent instability in the amplifier during the non-linear mode. The net result is that the entire amplifier apparatus operates linearly at low input signal levels but logarithmically at high input signal levels. The amplifier apparatus illustrated in FIG. 4 is described in further detail in U.S. patent application Ser. No. 264,521 filed May 18, 1981 and in the corresponding European Patent Application No. 82302487.2.

Figure 2:
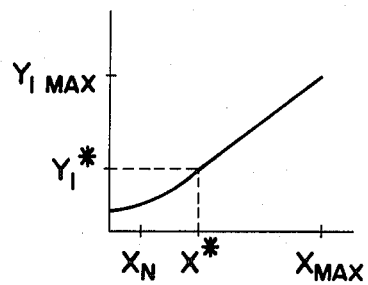
FIGS. 2 and 3 are graphs having values of output signal level plotted as ordinates on a linear scale and, as abscissae, values of input signal level plotted on a logarithmic scale.

FIG. 5 illustrates the first amplifier stage 10. The first portion is represented simply as a lin/log amplifier 10a. The output from amplifier 10a is connected to summing amplifier 50 via delay line 43, and is also coupled to push-pull limiter amplifier 46, which limits the output from amplifier 10a at a preset level corresponding to the transition from linear to logarithmic operation of the amplifier apparatus 10a. The output current of the amplifier 46 is proportionally divided so that approximately one-half of the output current of limiter 46 is supplied to lin/log amplifier 48 and the other half is inverted and supplied to summing amplifier 50 via delay line 52. Delay line 52 compensates for the transmission time through the amplifier 48, whereas delay line 43 compensates for the transmission time through both the limiter 46 and the amplifier 48. The limited and proportionally divided output from limiter 46 is amplified by log amplifier 48 and supplied to summing amplifier 50. The summing amplifier adds the output of the amplifier 10a to the inverted and limited signal coupled through delay line 52. Large signals, which were logarithmically amplified by the first amplifier 10a (FIG. 4), are transferred linearly to the output 40 by delay line 43 and summing amplifier 50. Limiting amplifier 46 produces a constant DC output for these large signals (which exceed its pre-set limiting level). Small signals which were passed linearly by the amplifier apparatus 10a are transferred logarithmically to the output 40 by limiter 46 logarithmic amplifier 48 and summing amplifier 50. For these low level signals, the contributions from the delay lines 52 and 43 cancel at the summing amplifier 50. In this manner, the desired logarithmic gain characteristic shown in FIG. 2 is obtained. The amplifier apparatus which is described with reference to FIG. 5 is also described in U.S. patent application Ser. No. 450,303, filed Dec. 16, 1982, the disclosure of which is hereby incorporated by reference herein.

Figure 6:
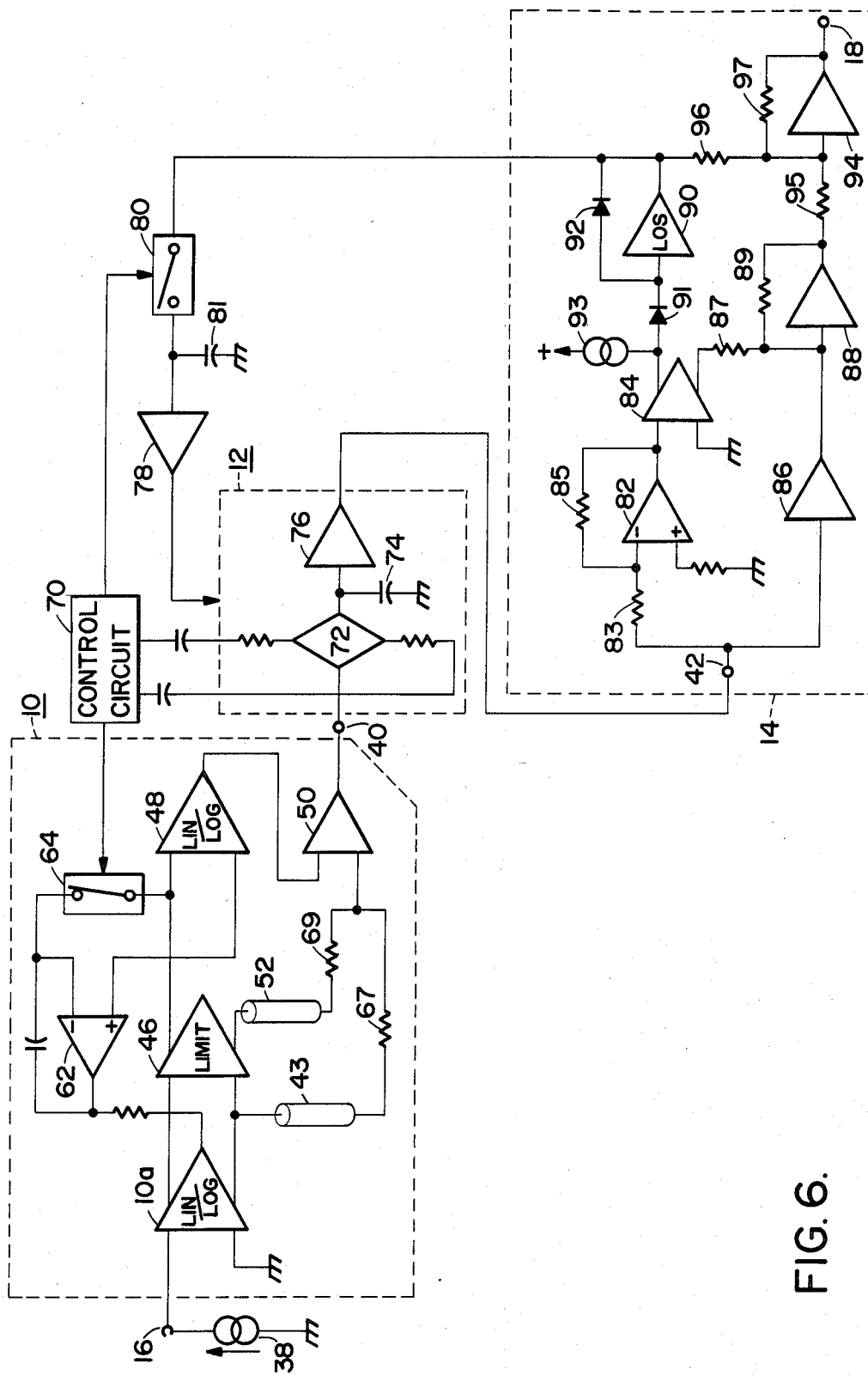

FIG. 6 is a more detailed block diagram of one preferred embodiment of the non-linear amplifier system according to this invention. First amplifier stage 10 consists of the lin/log amplifier 10a, limiter amplifier 46, amplifier 48, and summing amplifier 50, as described with reference to FIGS. 4 and 5, and drift compensation amplifier 62. For a smooth transition from linear to logarithmic transfer function of the first amplifier state 10 at a pre-set input signal level, amplifier 10a exhibits respectively linear and logarithmic transfer function below and above that signal level, and limiter 46 transmits to log amplifier 48 only signal levels corresponding to input signals below the pre-set level established by current source 26. The log amplifier 48 amplifies signal levels corresponding to input signal levels below and above a second pre-set level, which is below the first pre-set level established by the current source 26, respectively in linear and logarithmic manner. The second pre-set level, defining the transition from linear to logarithmic amplification of the amplifier 48 and of the overall amplifier stage 10, is arbitrary and may be varied depending on the amount of dynamic range required. However, it must be above the noise level of the input signal, in order for the sampling operation to eliminate the noise and not generate a logging error. The outputs from amplifier 10a, limiter 46 and log amplifier 48 are combined by summing amplifier 50. Transmission lines 43 and 52, e.g. coaxial cables with delay times of 2.5 ns and 1.25 ns, are used to match the propagation delay time of the three signals before being combined. Summing amplifier 50 may include common base transistors in the input stage and resistors 67, 69 are used for termination of delay lines 43, 52 with their characteristic impedance. As is discussed hereinafter, control circuit 70 generates various pulses including one for controlling zero level correction switch 64. Such pulse is generated prior to each sampling operation, in order to apply a correction signal to amplifier 10a. Consequently, first amplifier 10 exhibits linear and logarithmic transfer functions smoothly over the entire dynamic range.

Signal sampler 12 may be of conventional design comprising diode bridge 72, memory capacitor 74 and buffer amplifier 76. Diode bridge 72 is repeatedly rendered conducting under control of sampling command pulse from control circuit 70 in order to acquire the instantaneous signal level at the output of amplifier 50. A feedback signal from second amplifier 14 is applied to sampler 12 to eliminate DC offsets. That is, the output from second amplifier 14 is periodically sampled by sampling gate 80 and the samples stored in memory capacitor 81 are fed back to signal sampler 21 via buffer amplifier 78.

Second amplifier stage 14 consists, in this embodiment, of an inverter amplifier 82 having input and feedback resistors 83, 85, limiter 84, amplifier 86, summing amplifier 88 having input and feedback resistors 87, 89, current source 93, logarithmic amplifier 90 including diodes 91, 92 and summing amplifier 94 including resistors 95, 96, 97.

Operational amplifier 82 amplifies the output signal from sampler 12 linearly with the gain of four, for example, determined by the ratio of the resistance values of the resistors 83, 85. The output is fed to limiter 84 which operates linearly at signal levels below the second pre-set level. One output of the limiter 84 is added to the output from amplifier 86 by summing amplifier 88, while the other output from limiter 84 is logarithmically amplified by amplifier 90 before being combined by summing amplifier 94 with the output from summing amplifier 88. Diodes 91 and 92 provide a logarithmic transfer function of amplifier 90. Since limiter 84 saturates when the input signal level at input terminal 16 reaches the second pre-set level, no signal is supplied to logarithmic amplifier 90 and summing amplifier 88 by limiter 84 at signal levels above the second preset level. However, amplifier 86 continues to provide linear amplification even above such signal level.

FIGS. 7A, B and C show electrical circuit schematics of one practical embodiment of the amplifier apparatus 10. First section 10a is a balanced differential feedback amplifier (with a differential voltage gain of, e.g. seven), and including a pair of DMOS (double diffused metal oxide semiconductor) FETs 100, 102 to achieve high input impedance and low noise. FETs 100, 102 drive pnp transistors 118, 120 which provide the voltage gain determined by the resistance ratio of resistors [113+115] and 117 (or [115+113[ and 119). The collector outputs of transistors 118, 120 are applied to the bases of output emitter follower transistors 122, 124 which provide the inputs to limiter section 46 described hereinafter in detail. Variable resistor 130 determines the input level to summing amplifier 50 by way of terminal 160. Resistors 123, 125 of slightly different resistance are coupled between the emitters of transistors 122, 124. The junction voltage of such resistors 123, 125 is applied to the non-inverting input of operational amplifier 126. The emitter voltage of transistor 122 is routed to the input terminal or the gate of FET 100 via diode 114 and capacitor 112. The junction of capacitor 112 and diode 114 is connected through diode 116 to the output of amplifier 126. The gates of FETs 100 and 102 are connected to ground each through a series combination of a Schottky barrier diode 104 or 106 and a resistor. A forward bias current is supplied to each diode 104, 106 via high resistors 108, 110 constituting current sources along with a temperature compensation voltage source $V_{TC}$ described hereinafter.

The intended logarithmic characteristic is obtained by the use of Schottky barrier diode 104, and similar diode 106 is used to compensate for the DC offset in diode 104. Diodes 104, 106 are biased at a certain low forward current, e.g. 1.37 $\mu$A. As the current through diode 104 increases, the voltage across the diode changes from a linear to logarithmic characteristic. Positive feedback is provided by capacitor 112 and diode 114 to reduce input capacitance and thereby maintain the amplifier bandwidth at low signal current levels, while at high signal current levels the reduced impedance of diode 104 maintains amplifier bandwidth. With input signal currents of approximately 10 $\mu$A and greater, the positive feedback to the amplifier is cut off by reverse biasing of diode 114 to prevent amplifier instability during the logarithmic mode. The circuit including operational amplifier 126 and diode 116 is used to maintain substantially identical current through diodes 114 and 116 in the quiescent condition.

Limiter section 46 consists of cascade connected two stage differential transistors 132, 134, 138 and 140 in addition to associated circuit components including current sources 136, 141 and resistors 133, 135, 141, 142. Current source 136 and resistors 133, 135 are so selected that only input signal levels lower than the first pre-set level are allowed to pass through limiter 46. In other words, when the input signal reaches this level, transistor 132 turns off, thereby saturating the limiter amplifier 56. However, any signal levels below this level are transmitted linearly.

As mentioned hereinafter, the collector outputs of transistors 124 and 140 are applied through appropriate transmission lines 43 and 52 for delay time compensation to summing amplifier 50 (FIG. 7C). It should be noted that these two collector currents are of opposite polarity, thereby subtracting part of the output of the limiter 46 from the output of amplifier 10a to make linear the transition from one logarithmic amplifier to another. Below the first pre-set level, the output from the collector of transistor 124 is negligible compared to the output of amplifier 58 described hereunder.

Referring now to FIG. 7B, a practical embodiment of lin/log amplifier 48 will be described. The collector current from transistor 138 is applied to the amplifier 48 via terminal 145. This amplifier is similar in construction to amplifier 10a and operates much the same way, so similar reference numericals are used to show like elements and the following descriptions are directed only to the differences.

The amplifier including FETs 100', 102' and transistors 118', 120', 122' and 124' is essentially the same as the one in amplifier 10a except that no non-linear feedback device, i.e, diode 114, is interposed in series with feedback capacitor 112' and that the input signal current source 38' is connected to the gate of FET 102'. The difference between the collector current of transistor 138 (FIG. 7A) and the current provided by the current source 142, represented by signal current source 38' in FIG. 7B, is supplied to amplifier 42 to drive logarithmic diode 106'. Diode 104' connected between the gate of FET 100' and ground is biased at, e.g. 10 $\mu$A through resistor 108' and temperature compensation voltage $V_{TC}$ from temperature compensation circuit 150 including two operational amplifiers 152, 156, resistors 153, 155, 157, 158 and potentiometer 154. Similarly, diode 106' is biased through resistor 110'. The collector output from transistor 124' is fed to summing amplifier 50 (FIG. 7C). Although not shown in FIG. 7B but shown in FIG. 6, logarithmic amplifier zero pulses are applied periodically to sampling gate 64 to acquire the sample voltage across diode 106' for comparison by comparator 62 with the voltage across diode 104'. The output voltage of comparator 62 is then fed via resistor to the base of transistor 120 in first amplifier 10a for establishing a known current in diode 106' (10 $\mu$A in this case).

Temperature correction is made as follows: A pair of matched diodes 104' and 104" are employed to sense temperature variations by the voltage across diode 104" which is amplified by amplifiers 152 and 156 to develop temperature correction voltage $V_{TC}$. The bias currents for diodes 106' and 104' (FIG. 7A), are automatically controlled to cancel the effect of such temperature variations.

Shown in FIG. 7C is summing amplifier 50 for combining the outputs from three sections 10a, 46 and 48. Summing amplifier 50 comprises common emitter input stage transistors 163, 164, 165 for receiving the output signals from amplifier 10a, limiter 46 and amplifier 48; differential amplifier transistors 166, 167 with the emitters thereof connected to respective current sources 174, 175 and coupled together through variable resistance FET 169 and associated resistor network 170, 171, 172; output common base transistor 176; and temperature correction circuit 177 for controlling the gate voltage of FET 169. Temperature correction circuit 177 includes operational amplifier 178 responsive to temperature correction voltage $V_{TC}$, matched transistor pair 179, 180 with the emitters thereof returned to a negative voltage through resistors 189, 190, FET 181 closely matched to FET 169, and associated resistive network 182, 183, 184, 185.

In operation, differential transistors 166, 167 amplify the signals applied to their bases with a certain gain determined by the combined resistance of FET 169 and resistors 170, 171. Since the output from the amplifier 48 is of opposite polarity to the output signal from the amplifier 10a, they are amplified by summing amplifier 50 to provide at output terminal 40 the added output signals of the amplifier sections 10a and 48 but subtracting the output signal from limiter 46.

It should be noted that resistors 170, 171, 183,184 have equal resistance and so have resistors 172, 185. Temperature correction circuit 177 operates in such a manner that the channel resistance of FET 181 follows the $V_{TC}$ because both input terminals of operational amplifier 178 are at the same voltage. The collector current of transistor 179 is accurately reproduced by transistor 180, thereby adjusting the channel resistance of FET 169 exactly the same as that of FET 181. This changes the gain of summing amplifier 50 to compensate for changes in the gain of logging diodes 106' (FIG. 7B) and 104 (FIG. 7A) with temperature.

Shown in FIG. 8 is an electrical circuit schematic of a practical embodiment of the second amplifier stage 14. This circuit essentially follows the circuit arrangement shown in FIG. 6. For ease of description, like reference numerals are used to represent like elements.

The linear amplifier including operational amplifier 82 and resistors 83, 85 is an inverting amplifier with a voltage gain of four. The output signal from the amplifier drives the limiter of differential amplifier 84 including a pair of transistors 200, 202 with the emitters thereof connected to current source 208 through resistors 204, 206, respectively.

Limiter amplifier 84 operates as a linear amplifier for small signals. Transistor 200, however, turns off when the input signal level reaches a certain pre-set level, which may be the same as the second pre-set level. The limiting level depends on the resistance of resistors 204, 206 and the current level from current source 208. A fraction of collector current of transistor 202 is added to the output signal from amplifier 86.

Low signals furnished from limiter 84 are subjected to logarithmic conversion by logarithmic amplifier comprising operational amplifier 90 and nonlinear feedback element 92'. Feedback element 92' includes a pair of matched diodes a, b; one is used for the feedback element and the other for temperature compensation of the logarithmic amplifier. Diode 92b along with resistors 212, 214, 219 and potentiometer 216 form a voltage divider for establishing the temperature compensated bias voltage for the noninverting input terminal of amplifier 90. The logarithmic amplifier amplifies the signal current supplied thereto through diode 91. The logarithmic output is supplied to summing amplifier 94 for summing with the output from limiter 84 and amplifier 86. The overall gain of the logarithmic amplifier may be adjusted by varying feedback resistor 97.

Amplifier 86 comprising a pair of transistors 222, 224, emitter coupling resistors 226, 228 and feedback resistor 232 is used to compress input signals higher than a further pre-set level, which is above the first pre-set level. The primary purpose of this circuit is to improve the logarithmic transfer function. The circuit forms a parallel path with resistor 232, providing for example an equivalent 20K$\Omega$ resistance driving amplifier 88 for a gain of one if 20K$\Omega$ is used for feedback resistor 89. With signals above the futher pre-set level, transistor 222 is turned off, thereby increasing the equivalent resistance to reduce the gain. The collector output of transistor 202 is summed with the compressed output of amplifier 86 to improve the linear transition from one logarithmic amplifier to another.

It will be appreciated that the invention is not restricted to the various circuits which have been described and illustrated, since it will be apparent to those skilled in the art that variations may be made therein without departing from the scope of the invention as defined in the appended claims, and equivalents thereof.

We claim:

1. A non-linear amplifier system for a repetitive input signal, comprising:
   a first amplifier stage for amplifying low level input signals in a linear manner and higher level input signals in a non-linear manner, whereby low level noise signals are amplified linearly;
   a sampling circuit for smoothing the output from said first amplifier stage and thereby reducing the amplitude of low level random noise signals; and
   a second amplifier stage for receiving the output from the sampling circuit and amplifying in a non-linear manner signals corresponding to low level input signals of the first amplifier stage and amplifying in linear manner signals correspondjng to higher level input signals of the first amplifier stage, whereby low level input signals can be amplified in non-linear manner without introducing substantial errors due to non-linear amplification of low level random noise signals.

2. A non-linear amplifier system according to claim 1, wherein said first amplifier stage comprises a first amplifier apparatus and a second amplifier apparatus.

3. A non-linear amplifier system according to claim 2, wherein said first amplifier apparatus comprises an amplifier having a non-linear feedback element.

4. A non-linear amplifier system according to claim 1, wherein said second amplifier apparatus includes cascade connected input, intermediate and output sections and a summing amplifier for combining the outputs from said three sections.

5. A non-linear amplifier system according to claim 4, wherein said input section is a non-linear amplifier, said intermediate section is a limiter amplifier and said output section is a non-linear amplifier.

* * * * *